United States Patent [19]
Kerbel

[11] B 3,987,376
[45] Oct. 19, 1976

[54] ACOUSTIC SURFACE WAVE DEVICE WITH HARMONIC COUPLED TRANSDUCERS

[75] Inventor: Sheldon J. Kerbel, Merrick, N.Y.

[73] Assignee: Hazeltine Corporation, Greenlawn, N.Y.

[22] Filed: Mar. 22, 1974

[21] Appl. No.: 453,616

[44] Published under the second Trial Voluntary Protest Program on January 27, 1976 as document No. B 453,616.

[52] U.S. Cl. .............................. 333/30 R; 310/9.8; 333/72
[51] Int. Cl.² ...................... H03H 9/26; H03H 9/30; H03H 9/32; H01L 41/08
[58] Field of Search ................ 333/30 R, 72; 310/8, 310/8.1, 9.7, 9.8, 9.4, 8.2, 8.3

[56] References Cited
UNITED STATES PATENTS

| | | | |
|---|---|---|---|
| 3,376,572 | 4/1968 | Mayo | 333/72 X |
| 3,614,463 | 10/1971 | Slobodnik, Jr. | 333/30 R |
| 3,727,155 | 4/1973 | De Vries | 333/72 |
| 3,742,396 | 6/1973 | Bahr et al. | 333/30 R |

OTHER PUBLICATIONS

Kuhn— "Enhanced Harmonic Response of an Interdigital Surface Acoustic Wave Transducer" in IEEE Trans. Electron Devices, June 1971, p. 395.
White et al.— "Direct Piezoelectric Coupling to Surface Electric Waves" in Applied Physic Letters, vol. 7, No. 12, Dec. 15, 1965, pp. 314–316.
Engan— "Excitation of Elastic Surface Waves by Spatial Harmonics of Interdigital Transducers" in IEEE Trans. on Electron Devices, vol. ED16, No. 12, Dec. 1969; pp. 1014–1017.

*Primary Examiner*—Archie R. Borchelt
*Assistant Examiner*—Marvin Nussbaum

[57] ABSTRACT

Disclosed is an acoustic surface wave device having surface wave transducers coupled to a piezoelectric substrate by harmonic coupling. In one embodiment the device has two transducers, each having a different selected fundamental periodicity and harmonic piezoelectric coupling in a selected range of operating frequencies.

7 Claims, 5 Drawing Figures

ACOUSTIC SURFACE WAVE DEVICE WITH HARMONIC COUPLED TRANSDUCERS

BACKGROUND OF THE INVENTION

This invention relates to acoustic surface wave devices. Such devices are well known and commonly used for filters, delay lines, matched filters and pulse expansion and compression devices.

Acoustic surface waves may be launched on a piezoelectric substrate by applying electric signals to a suitable transducer. Likewise a transducer may be used to convert such acoustic surface waves into electrical signals. Acoustic surface waves have a propagation velocity which is much lower than the propagation velocity of electrical signals. This property is useful in utilization of acoustic surface wave devices as filters and delay lines.

The most commonly used acoustic surface wave transducer is the "interdigital" transducer which comprises interleaved arrays of conductive fingers disposed on one surface of the piezoelectric substrate. The interleaved arrays usually have a fundamental periodicity at which the pattern of conductive fingers is repeated which is approximately equal to one wavelength at the operating frequency of the transducer. Typical interdigital transducers are described in U.S. Pat. Nos. 3,581,248 (DeVries) and 3,727,155 (DeVries) which show respectively interdigital transducer with two and four conductive fingers per acoustic wavelength. Another transducer having three conductive fingers per acoustic wavelength is described in the copending application of C. F. Vasile, Ser. NO. 453,617 filed Mar. 22, 1974, entitled "Surface Wave Transduer having Three Conductive Fingers per Acoustic Wavelength," which is assigned to the same assignee as the present application.

In an article entitled "Excitation of Elastic Surface Waves by Spatial Harmonics of Interdigital Transducers," by Helge Engan which was published in *IEEE Transactions on Electronic Devices*, Dec. 1969, there is described the coupling effect of an interdigital transducer at the harmonics of the frequency at which the fundamental periodicity corresponds to one wavelength for a transducer having two conductive fingers per acoustic wavelength. In that article it is shown that a transducer can be made to operate efficiently at certain harmonics of the frequency corresponding to the fundamental periodicity of the transducer.

It is therefore an object of the present invention to provide an acoustic surface wave device having surface wave transducers coupled to a piezoelectric substrate by harmonic coupling.

It is a further object of the present invention to provide such a device for operation in a selected range of frequencies having two transducers wherein each transducer has a different fundamental periodicity and has harmonic coupling in the selected range of frequencies.

In accordance with the present invention, there is provided an acoustic surface wave device which operates over a selected range of frequencies. This device includes a piezoelectric substrate and a first surface wave transducer having a first selected fundamental periodicity and having a first set of harmonic responses only one of which lies substantially within said selected range of frequencies. The device further includes a second surface wave transducer having a second selected fundamental periodicity, differing from said first selected fundamental periodicity, and having a second set of harmonic responses, only one of which overlaps substantially with any of the harmonic responses of said first transducer, said overlap occurring within said selected range of frequencies.

For a better understanding of the present invention together with other and further objects thereof, references head the following description, taken in conjunction with the accompanying drawings, while its scope will be pointed out in the appended claims.

DESCRIPTION AND OPERATION OF THE EMBODIMENT OF FIG. 1

Figures 1, 1A:
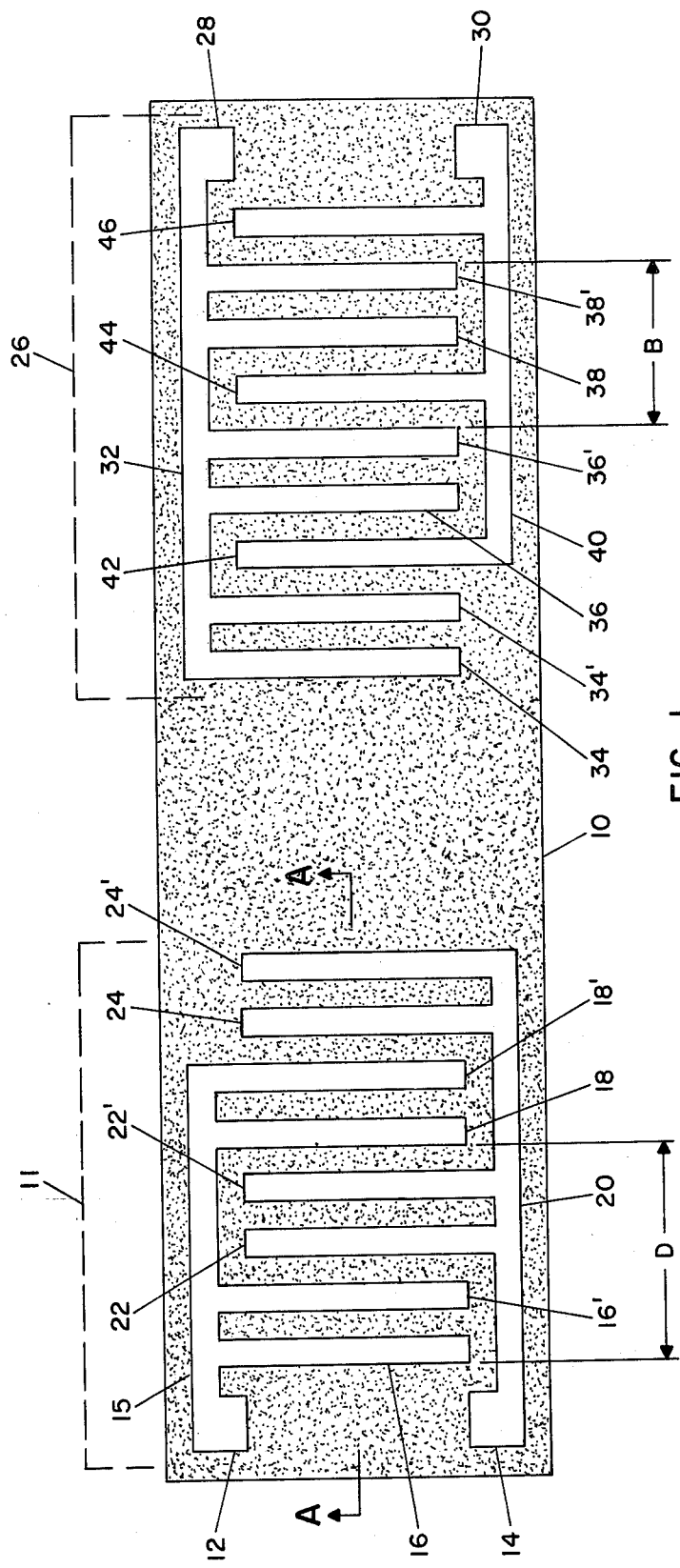
FIGS. 1 and 1A show an acoustic surface wave device constructed in accordance with the present invention.

FIG. 1 shows an acoustic surface wave device embodying the present invention. The device includes a piezoelectric substrate 10 which may be a crystal of lithium niobate or other suitable piezoelectric material. The device also includes a first transducer 11, which is of the interdigital type, and a second transducer 26, which is of a different interdigital type. Both transducers are formed by depositing a thin film of conductive material on the substrate in the illustrated configuration.

Transducer 11 includes a first terminal 12 and a second terminal 14 for application of electrical signals. Terminal 12 is connected by conductive metal strip 15 to transducer fingers 16, 16', 18 and 18'. Terminal 14 is likewise connected by conductor strip 20 to transducer fingers 22, 22', 24 and 24'. This transducer is constructed in accordance with the teachings of U.S. Pat. NO. 3,725,155 and has a fundamental periodicity D, which is the periodicity on the substrate at which the pattern of conductive fingers repeats itself. Periodicity D corresponds to the wavelength of an acoustic surface wave at the fundamental design frequency of transducer 11. Transducer 11 has four conductive fingers for each acoustic wavelength corresponding to periodicity D. Application of electrical signals to the terminals of the transducer 11 causes acoustic surface waves to propagate on the surface of the substrate in a direction perpendicular to the conductive fingers.

Transducer 26 includes terminals 28 and 30 to which electrical signals may be applied. Terminal 28 is connected by conductor strip 32 to conductive fingers 34, 34', 36, 36', 38 and 38'. Terminal 30 is connected by conductor strip 40 to conductive fingers 42, 44 and 46. Transducer 26 has a fundamental periodicity B at which the pattern of conductive fingers is repeated. Periodicity B corresponds to the acoustic wavelength at the fundamental design frequency of transducer 26, which at its fundamental design frequency has three conductive fingers per acoustic wavelength. Transducer 26 is constructed in accordance with the invention described in the above referenced copending application of C. F. Vasile.

Figure 2:
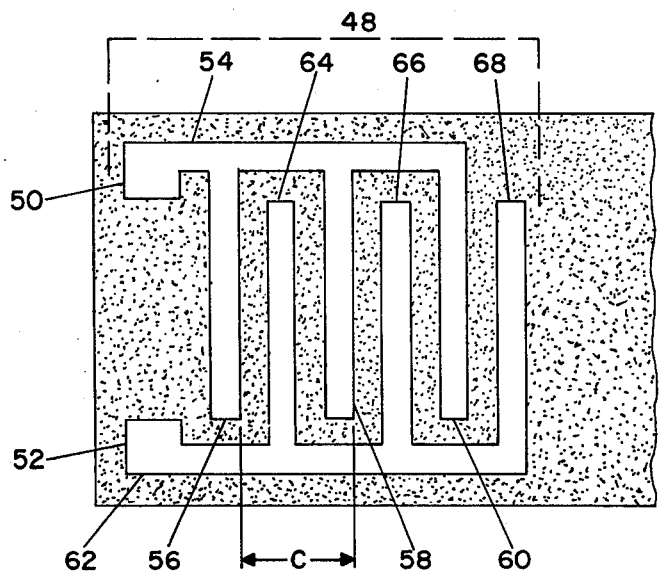
FIG. 2 shows part of an acoustic surface wave device having an alternative transducer type.

FIG. 2 shows an alternative transducer which may be used in an acoustic surface wave device of the type shown in FIG. 1. FIG. 2 shows an interdigital acoustic surface wave transducer 48 having terminals 50 and 52. Terminal 50 is connected by conductor strip 54 to conductive fingers 56, 58 and 60. Likewise, terminal 52 is connected by conductor strip 62 to conductive fingers 64, 66 and 68. Transducer 48 has a fundamental periodicity C which corresponds to a periodicity at which the pattern of conductive fingers is repeated. Periodicity C corresponds to one acoustic wavelength at the fundamental design frequency of transducer 48, which has two conductive fingers per acoustic wavelength at the fundamental frequency.

Figure 3:
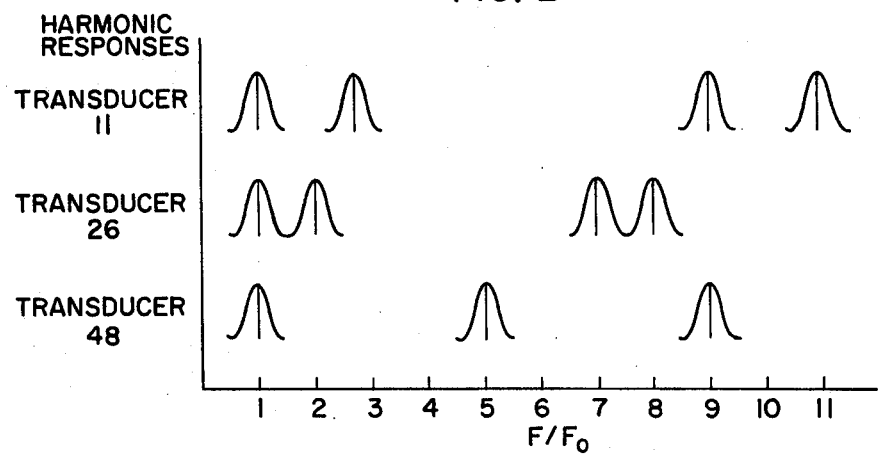
FIG. 3 shows the harmonic responses of transducers of the type illustrated in FIGS. 1 and 2.

The principles of the operation of the present invention may be more easily understood by reference to FIG. 3. FIG. 3 illustrates the harmonic responses of transducers 11, 26 and 48 if they were all constructed to have the identical periodicity. The harmonic responses are the frequencies of applied electrical signals which will couple to surface waves on the piezoelectric substrate. The harmonics illustrated are for transducers having conductive fingers of the same width as the spacings between fingers. Other harmonics are present for transducers with different width to spacing ratios. As illustrated in FIG. 3 all transducers operate over a range of frequencies centered around the frequency designated $F_o$ at which their fundamental periodicity corresponds to one acoustic wavelength. All of the transducers also operate over certain other frequency bands centered around frequencies at which the fundamental periodicity is an integral multiple of the acoustic wavelength. These frequencies are integral multiples of $F_o$. Transducer 11, for example, operates at frequencies around its fundamental frequency $F_o$ and also at frequencies around a frequency which is three times the fundamental frequency, which is called the third harmonic. Transducer 11 also operates at frequencies around a frequency of 9 and 11 times the fundamental frequency, or the 9th and 11th harmonics. Transducer 26 operates at frequencies around the fundamental frequency and also at frequencies around the 2nd, 7th and 8th harmonics. Transducer 48 operates at frequencies around the fundamental frequency and also at frequencies around the 5th and 9th harmonics. The bandwidth of operation of the transducers around the fundamental and harmonic frequencies is dependent upon the detailed design of the transducer. Typically transducers which have a uniform fundamental periodicity and many conductive fingers operate over narrow bands. Transducers which have relatively few conductive fingers or have tapered periodicities over their length have broader operating bands. A transducer with tapered periodicity has a slightly different periodicity for each period of which the array pattern repeats itself. This type of transducer is commonly used for pulse expansion or pulse compression filtering devices. The criteria for designing transducers of this type are well known to those skilled in the art.

Figure 4:
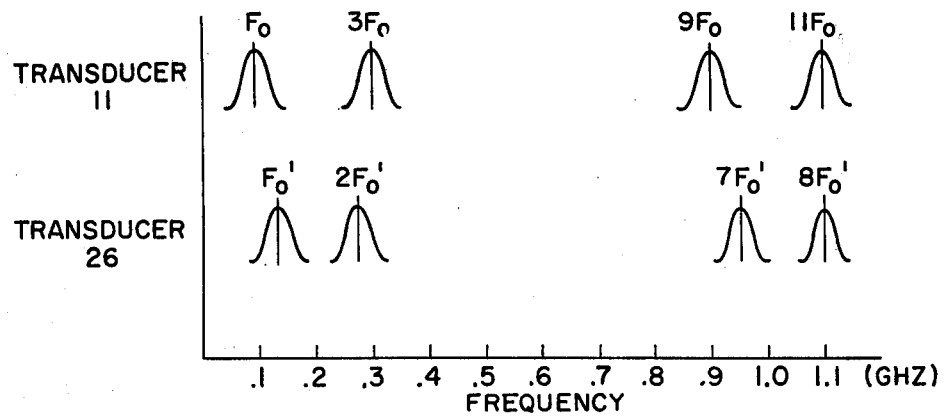
FIG. 4 shows the frequency harmonics of the transducers used in the device of FIG. 1.

Operation of the embodiment of the invention shown in FIG. 1 is illustrated in FIG. 4. Transducer 11, for example, may be designed to have a fundamental periodicity corresponding to one acoustic wavelength at a frequency of 100 MHz. Transducer 11 therefore has harmonic coupling to surface waves at frequencies around 300, 900 and 1100 MHz. Transducer 26 is designed to have a fundamental periodicity corresponding to one acoustic wavelength at 137 MHz. Transducer 26 therefore has harmonic coupling to surface waves at frequencies around 275 MHz, 965 MHz and 1100 MHz. It may be noted that both transducer 11 and transducer 26 have harmonic coupling to surface waves at frequencies around 1100 MHz. Therefore, electrical signals in that frequency band will be passed by both transducer 11 and transducer 26, whereas signals at frequencies outside that frequency band including those at other harmonics of transducer 11 and transducer 26 will not be passed by both transducers. The acoustic surface wave device of FIG. 1 is therefore inherently useful as a filter having a passband of frequencies around 1100 MHz.

One of the advantages of the acoustic surface wave device of FIG. 1 may be seen with reference to the foregoing description. In the transducer 11 of FIG. 1 the fundamental periodicity of the interdigital transducer corresponds to one acoustic wavelength at a frequency of 100 MHz. The required interdigital conductive finger spacings are therefore much larger than the spacings that would be required for a transducer having a fundamental periodicity corresponding to one acoustic wavelength at the actual operating frequency of 1100 MHz. Likewise, transducer 26 has a fundamental periodicity corresponding to one acoustic wavelength at 137 MHz. Since transducer 26 is designed to operate at a higher frequency than transducer 11 but has only 3 conductive fingers per acoustic wavelength rather than 4 as in transducer 11, the resolution of the conductive fingers for transducers 11 and 26 is approximately the same and corresponds to approximately 4 conductive fingers per acoustic wavelength at a frequency of 100 MHz. However, the acoustic surface wave device operates at a much higher frequency, that is 1100 MHz.

The present invention therefore has the advantage of enabling operation of a surface wave device at a frequency much higher than the frequency at which the fundamental periodicity corresponds to one acoustic wavelength, consequently, the resolution required for fabricating the conductive fingers of the transducer is significantly less than would be required in prior art designs. Furthermore, the use of transducers with different fundamental periodicities and different harmonics elminates the possibility of unwanted harmonic response in a surface wave device such as a filter.

It will be recognized by those skilled in the art that many variations may be had by using alternative harmonic responses of transducers of the types shown. Also there are other types of transducers known in the art which have different harmonic responses than the transducers illustrated in FIGS. 1 and 2.

One such alternative device utilizing the present invention is a surface wave device which utilizes the 9th harmonic of transducer 11 and the 5th harmonic of transducer 48. In such a device transducer 11 may have a periodicity corresponding to one acoustic wavelength at 100 MHz and a 9th harmonic coupling to surface waves at 900 MHz. Transducer 48 might be designed to have a periodicity corresponding to one acoustic wavelength at 180 MHz and consequently have a 5th harmonic of coupling to surface waves at 900 MHz. The device could therefore operate at 900 MHz and have substantially no response at the other harmonics of either transducer.

While there have been described what are at present considered to be the preferred embodiments of this invention, it will be obvious to those skilled in the art that various changes and modifications may be made therein without departing from the invention and it is, therefore, aimed to cover all such changes and modifications as fall within the true spirit and scope of the invention.

What is claimed is:

1. An acoustic surface wave device for operation over a selected range of frequencies, comprising:
    a piezoelectric substrate;
    a first surface wave transducer having a first selected fundamental periodicity and having a first set of harmonic responses, only one of which lies substantially within said selected range of frequencies;
    and a second surface wave transducer having a second selected fundamental periodicity, differing from said first selected fundamental periodicity, and having a second set of harmonic responses, only one of which overlaps substantially with any of the harmonic responses of said first transducer, said overlap occurring within said selected range of frequencies.

2. An acoustic surface wave device as specified in claim 1 wherein said first and second surface wave transducers are interdigital surface wave transducers.

3. An acoustic surface wave device as specified in claim 1 wherein said fundamental periodicities of said transducers are tapered periodicities.

4. An acoustic surface wave device as specified in claim 2 wherein said first transducer comprises an interdigital array of conductive fingers disposed on a surface of said substrate and having a spacing between corresponding fingers of said array which is a first integral multiple of the acoustic wavelength of surface waves on said substrate at the center frequency of the harmonic response which lies substantially within said selected range of frequencies;
    and wherein said second transducer comprises a second interdigital array of conductive fingers disposed on a surface of said substrate and having a spacing between corresponding fingers of said second array which is a second integral multiple, different from said first multiple, of the acoustic wavelength of surface waves on said substrate at the center frequency of the harmonic response of said second transducer which overlaps substantially the harmonic response of said first transducer that lies substantially within said selected range of frequencies.

5. An acoustic surface wave device as specified in claim 4 wherein said first transducer has four conductive fingers in said spacing between corresponding fingers of said first array and said second transducer has three conductive fingers in said spacing between corresponding fingers of said second array.

6. An acoustic surface wave device as specified in claim 4 wherein said first transducer has four conductive fingers in said spacing between corresponding fingers of said first array and said second transducer has two conductive fingers in said spacing between corresponding fingers of said second array.

7. An acoustic surface wave device as specified in claim 4 wherein said first transducer has three conductive fingers in said spacing between corresponding fingers of said first array and said second transducer has two conductive fingers in said spacing between corresponding fingers of said second array.

* * * * *